US012341314B2

(12) United States Patent
Luo et al.

(10) Patent No.: US 12,341,314 B2
(45) Date of Patent: Jun. 24, 2025

(54) CONDUIT SYSTEM, RADIATION SOURCE, LITHOGRAPHIC APPARATUS, AND METHODS THEREOF

(71) Applicant: Cymer, LLC, San Diego, CA (US)

(72) Inventors: Edward Siqi Luo, San Diego, CA (US); Thomas Dickson Steiger, San Diego, CA (US); Andrew Jay Effenberger, Jr., San Diego, CA (US); Mohammad Amin Khamehchi, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 230 days.

(21) Appl. No.: 17/912,996

(22) PCT Filed: Mar. 9, 2021

(86) PCT No.: PCT/US2021/021543

§ 371 (c)(1),
(2) Date: Sep. 20, 2022

(87) PCT Pub. No.: WO2021/206838

PCT Pub. Date: Oct. 14, 2021

(65) Prior Publication Data

US 2023/0163551 A1 May 25, 2023

Related U.S. Application Data

(60) Provisional application No. 63/005,845, filed on Apr. 6, 2020.

(51) Int. Cl.
*H01S 3/036* (2006.01)
*G03F 7/00* (2006.01)
(Continued)

(52) U.S. Cl.
CPC .......... *H01S 3/036* (2013.01); *G03F 7/70025* (2013.01); *H01S 3/034* (2013.01); *H01S 3/225* (2013.01)

(58) Field of Classification Search
CPC ...... G03F 7/70025; H01S 3/034; H01S 3/036; H01S 3/225; H01S 3/0346; C08F 10/02;
(Continued)

(56) References Cited

U.S. PATENT DOCUMENTS 4,610,014 A * 9/1986 Martinen ................ H01S 3/036 372/55
4,629,611 A 12/1986 Fan
(Continued)

FOREIGN PATENT DOCUMENTS

CN 101160698 A 4/2008
CN 103080840 A 5/2013
(Continued)

OTHER PUBLICATIONS

Office Action, Japanese Counterpart Application No. 2022-555845, mailed Aug. 16, 2023, 14 total pages (including English translation of 8 pages).

(Continued)

*Primary Examiner* — Deoram Persaud
(74) *Attorney, Agent, or Firm* — DiBerardino McGovern IP Group LLC

(57) ABSTRACT

A pulsed-discharge radiation source includes a gas chamber, a window, and a conduit system. The conduit system includes a refill path and a conduit. The pulsed-discharge radiation source generates radiation. The gas chamber confines a gas and contaminants produced during the generation of radiation. The window isolates the gas from an environment external to the gas chamber and allows the radiation to travel between the gas chamber and the environment. The
(Continued)

refill path allows a replacement of the gas. The conduit circulates the gas to or from the gas chamber during the generating. The conduit system directs a flow of one of a refill gas, the gas, or the refill gas and the gas at least during a refill operation to prevent the contaminant from contacting the window, whereby the conduit system increases the usable lifetime of at least the window.

20 Claims, 11 Drawing Sheets

(51) Int. Cl.
*H01S 3/034* (2006.01)
*H01S 3/225* (2006.01)

(58) Field of Classification Search
CPC ...... C08F 110/02; C08F 2/34; C08F 2500/18; C08F 4/6465; C08F 4/649; C08F 4/6543
See application file for complete search history.

(56) References Cited

U.S. PATENT DOCUMENTS

| | | | | |
|---|---|---|---|---|
| 6,490,307 | B1 | 12/2002 | de Mos et al. | |
| 9,673,588 | B1 | 6/2017 | Hersman et al. | |
| 9,989,844 | B2 | 6/2018 | Yakunin et al. | |
| 2005/0128448 | A1 | 6/2005 | Box et al. | |
| 2005/0169341 | A1 | 8/2005 | Bergmann et al. | |
| 2008/0130701 | A1* | 6/2008 | Den Hurk | H01S 3/036 372/55 |
| 2011/0243177 | A1* | 10/2011 | Nishio | H01S 3/09702 372/58 |
| 2014/0247855 | A1* | 9/2014 | Yamamoto | H01S 3/036 372/58 |

FOREIGN PATENT DOCUMENTS

| | | | |
|---|---|---|---|
| JP | S61251186 | A | 11/1986 |
| JP | S63108786 | A | 5/1988 |
| JP | H03200386 | A | 9/1991 |
| JP | H06152013 | A | 5/1994 |
| JP | H07226550 | A | 8/1995 |
| JP | 2005175490 | A | 6/2005 |
| TW | 454370 | B | 9/2001 |
| TW | 200403905 | A | 3/2004 |

OTHER PUBLICATIONS

Anna Cortona, European International Searching Authority, International Search Report and Written Opinion, counterpart PCT Application No. PCT/US2021/021543, mailed Jun. 29, 2021, 10 pages total.

* cited by examiner

CONDUIT SYSTEM, RADIATION SOURCE, LITHOGRAPHIC APPARATUS, AND METHODS THEREOF

CROSS REFERENCE TO RELATED APPLICATIONS

This application claims priority to U.S. Application No. 63/005,845 filed Apr. 6, 2020 and titled CONDUIT SYSTEM, RADIATION SOURCE, LITHOGRAPHIC APPARATUS, AND METHODS THEREOF, which is incorporated herein in its entirety by reference.

FIELD

The present disclosure relates to pulsed-discharge radiation sources, for example, an ultraviolet gas discharge laser for lithographic systems.

BACKGROUND

Methods to produce deep ultraviolet (DUV) radiation include, but are not limited to, using a pulsed-discharge radiation source. An excimer laser is an example of a pulsed-discharge radiation source. Pulsed-discharge radiation sources excite gas molecules confined in a chamber to generate laser radiation of a desired wavelength. The radiation can be let out of the chamber through a window. The gas molecules can include, but are not limited to, fluorine, neon, krypton, argon, and the like. The gas molecules may be excited by supplying a voltage (e.g., an electrical pulse) to the gas via electrodes. Over the course of the radiation source's lifetime, the gas chamber may develop contaminant particles due to the interaction of the electrodes and the gas. The contaminant particles may then contaminate other optically sensitive parts (e.g., the window) and cause unexpected, early failure of the radiation source.

Pulsed-discharge radiation sources may be utilized for generating radiation in a variety of applications, for example, generating DUV radiation in lithographic apparatuses. A lithographic apparatus is a machine that applies a desired pattern onto a substrate, usually onto a target portion of the substrate. A lithographic apparatus can be used, for example, in the manufacture of integrated circuits (ICs). In that instance, a patterning device, which may be a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions in a direction parallel to and along the scanning direction, or parallel to and opposite the scanning direction.

A lithographic apparatus typically includes an illumination system that conditions radiation generated by a radiation source before the radiation is incident upon the patterning device. A patterned beam of DUV or light can be used to produce extremely small features on a substrate. The illumination system may include a pulsed-discharge radiation source having a gas chamber that can be susceptible to early failure due to contaminants in the gas chamber.

SUMMARY

Accordingly, it is desirable to protect optically sensitive components or otherwise reduce the likelihood of untimely failure of a pulsed-discharge radiation source due to contaminants, for example, by managing the flow of gas within the radiation source.

In some embodiments, a pulsed-discharge radiation source comprises a gas chamber, a window, and a conduit system. The conduit system comprises a refill path and a conduit. The pulsed-discharge radiation system is configured to generate radiation. The gas chamber is configured to confine a gas and a contaminant produced during the generating. The window is configured to isolate the gas from an environment external to the gas chamber and to allow the radiation to travel between the gas chamber and the environment. The refill path is configured to allow a replacement of the gas. The conduit is configured to circulate the gas to or from the gas chamber during the generating. The conduit system is configured to direct a flow of one of a refill gas, the gas, or the refill gas and the gas at least during a refill operation to prevent the contaminant from contacting the window, whereby the conduit system increases the usable lifetime of at least the window.

In some embodiments, a method comprises generating radiation using a pulsed-discharge radiation source, confining a gas and contaminants produced during the generating using a gas chamber, isolating the gas from an environment external to the gas chamber using a window, allowing the radiation to travel between the gas chamber and the environment using the window, replacing the gas using a refill path, circulating the gas to or from the gas chamber during the generating, and directing a flow of one of a refill gas, the gas, or the refill gas and the gas during a refill operation to prevent the contaminant from contacting the window.

In some embodiments, a lithographic apparatus comprises an illumination system and a projection system. The illumination system comprises a gas chamber, a window, and a conduit system. The illumination system is configured to illuminate a pattern of a patterning device. The gas chamber is configured to confine a gas and a contaminant produced during the generating. The window is configured to isolate the gas from an environment external to the gas chamber and to allow the radiation to travel between the gas chamber and the environment. The refill path is configured to allow a replacement of the gas. The conduit is configured to circulate the gas to or from the gas chamber during the generating. The conduit system is configured to direct a flow of one of a refill gas, the gas, or the refill gas and the gas at least during a refill operation to prevent the contaminant from contacting the window, whereby the conduit system increases the usable lifetime of at least the window. The projection system is configured to project an image of the pattern onto a substrate.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1A:
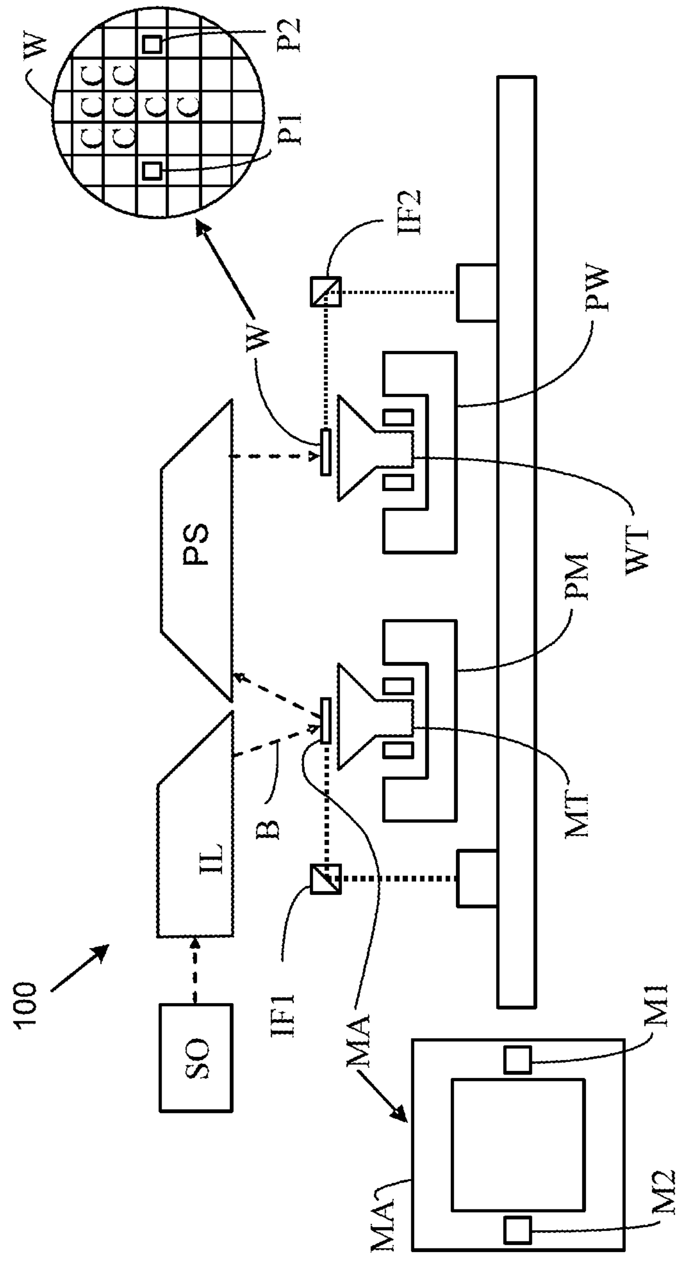
FIG. 1A shows a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an exemplary embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
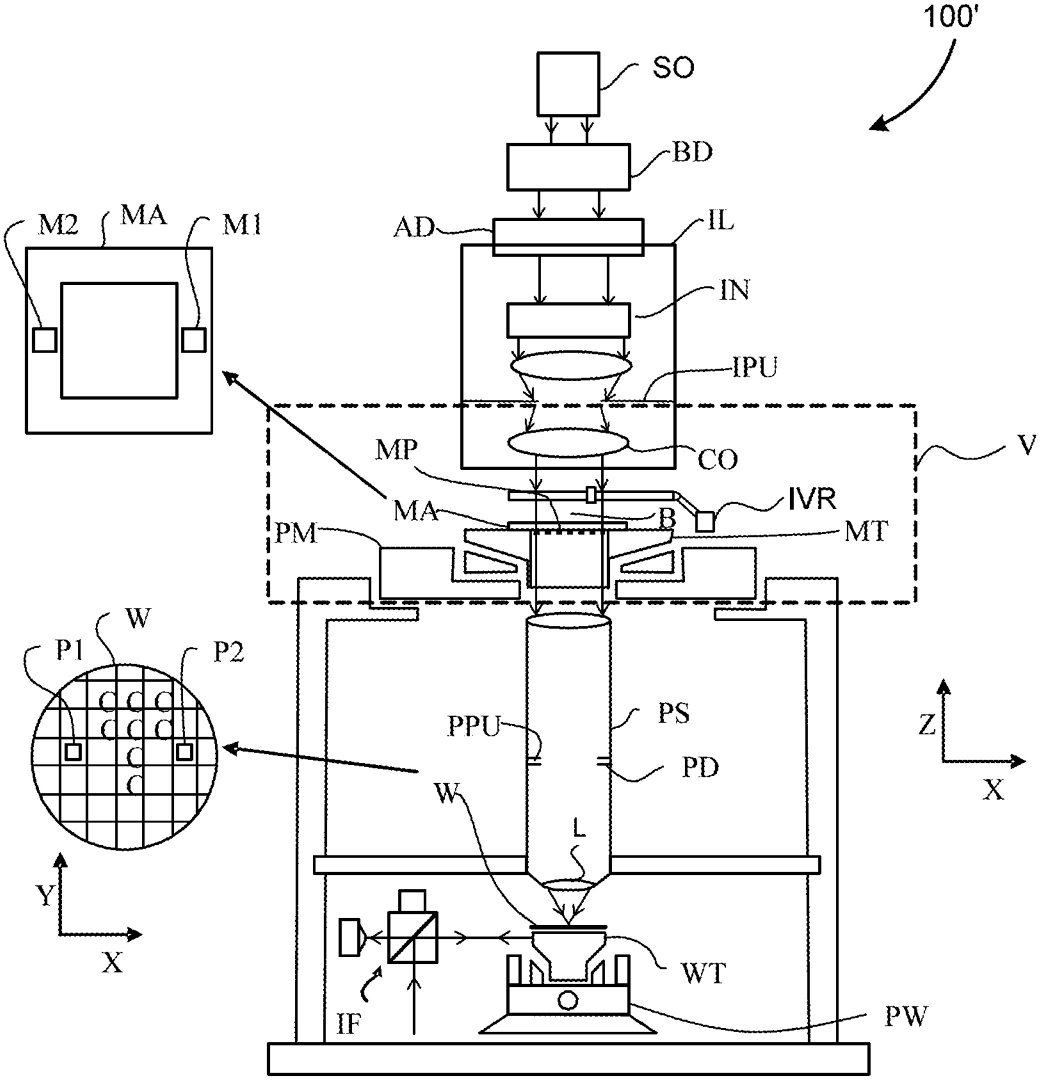
FIG. 1B shows a transmissive lithographic apparatus, according to some embodiments.

FIGS. 1A and 1B show schematic illustrations of a lithographic apparatus 100 and lithographic apparatus 100', respectively, in which embodiments of the present disclosure can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be provided to the whole beam path with the aid of a vacuum wall and vacuum pumps.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W.

The projection system PS projects an image of the mask pattern MP, where the image is formed by diffracted beams produced from the mark pattern MP by radiation from the intensity distribution, onto a photoresist layer coated on the substrate W. For example, the mask pattern MP can include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-) magnification and image reversal characteristics of the projection system PS.
3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In some embodiments, lithographic apparatus 100' includes a deep ultraviolet (DUV) source, which is configured to generate a beam of DUV radiation for DUV lithography. A DUV source can be, for example, a gas discharge laser (e.g., an excimer laser).

Exemplary Lithographic Cell

Figure 2:
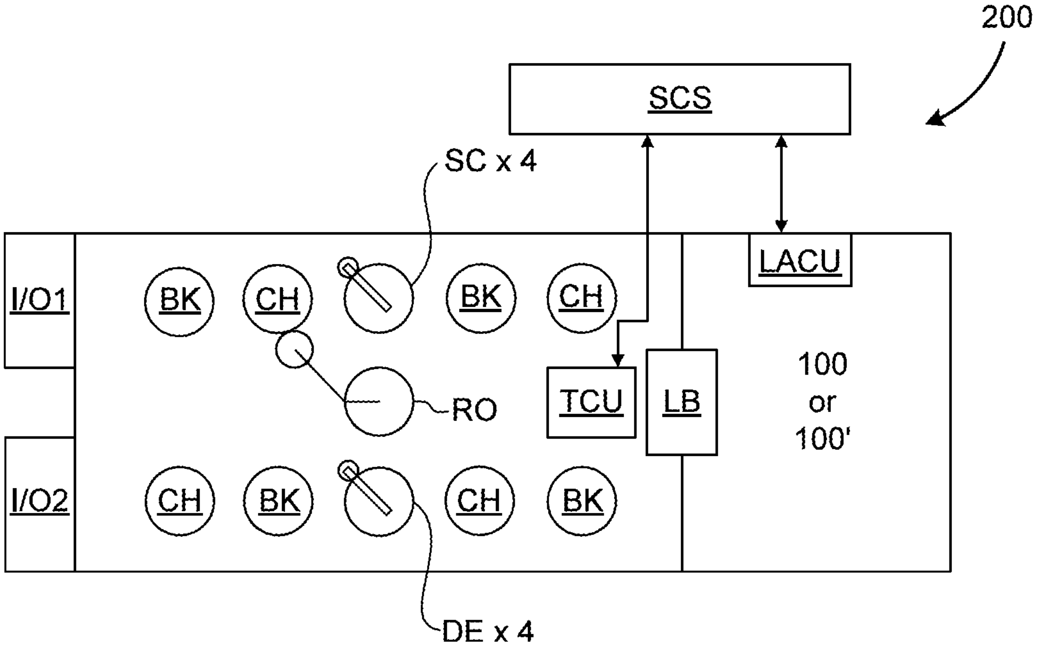
FIG. 2 shows a schematic of a lithographic cell, according to some embodiments.

FIG. 2 shows a lithographic cell 200, also sometimes referred to a lithocell or cluster, according to some embodiments. Lithographic apparatus 100 or 100' can form part of lithographic cell 200. Lithographic cell 200 can also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Radiation Source

Figure 3:
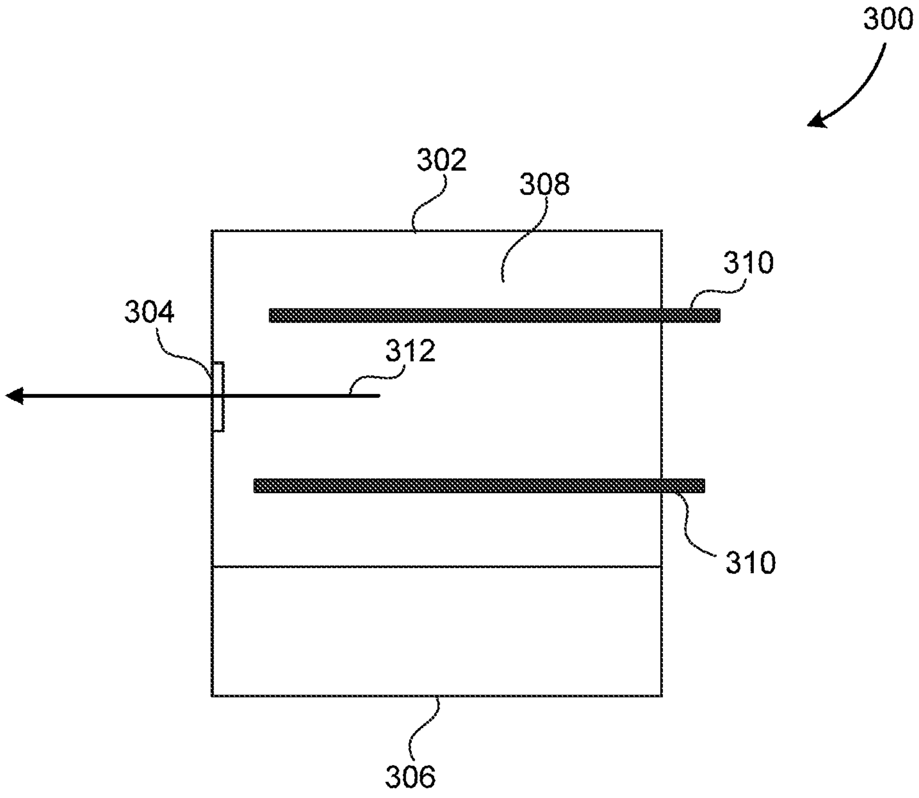
FIGS. 3 and 4 show radiation sources, according to some embodiments.

There exist many applications of pulsed-discharge radiation sources, for example, lithography, medical procedures, machining via laser ablation, laser imprinting, and more. A lithographic apparatus is one example in which a stable illumination source may be desirable. The illumination source can comprise precision optical assemblies that are sensitive to contaminants. FIG. 3 shows a radiation source 300, according to some embodiments. In some embodiments, radiation source 300 is a pulsed-discharge radiation source, for example and without limitation, a gas discharge laser. Radiation source 300 comprises a gas chamber 302, a window 304, and a conduit system 306. Radiation source 300 can further comprise one or more electrodes 310 (also "electrical connection"). Conduit system 306 can comprise a network of valves, conduits, and contaminant filters (not shown, but described in more detail in reference to FIG. 4).

In some embodiments, gas chamber 302 can confine a gas 308. Gas 308 can comprise fluorine, neon, krypton, argon, and the like. Conduit system 306 is connected to gas chamber 302. Conduit system 306 can allow management of gas 308 in gas chamber 302. For example, conduit system 306 can direct a flow (e.g., circulation) of gas 308 to a filter within conduit system 306 to purify gas 308. A voltage can be supplied to gas 308 (e.g., via one or more electrodes 310) to generate radiation 312. Window 304 can allow radiation 312 to exit gas chamber 302.

Figure 4:
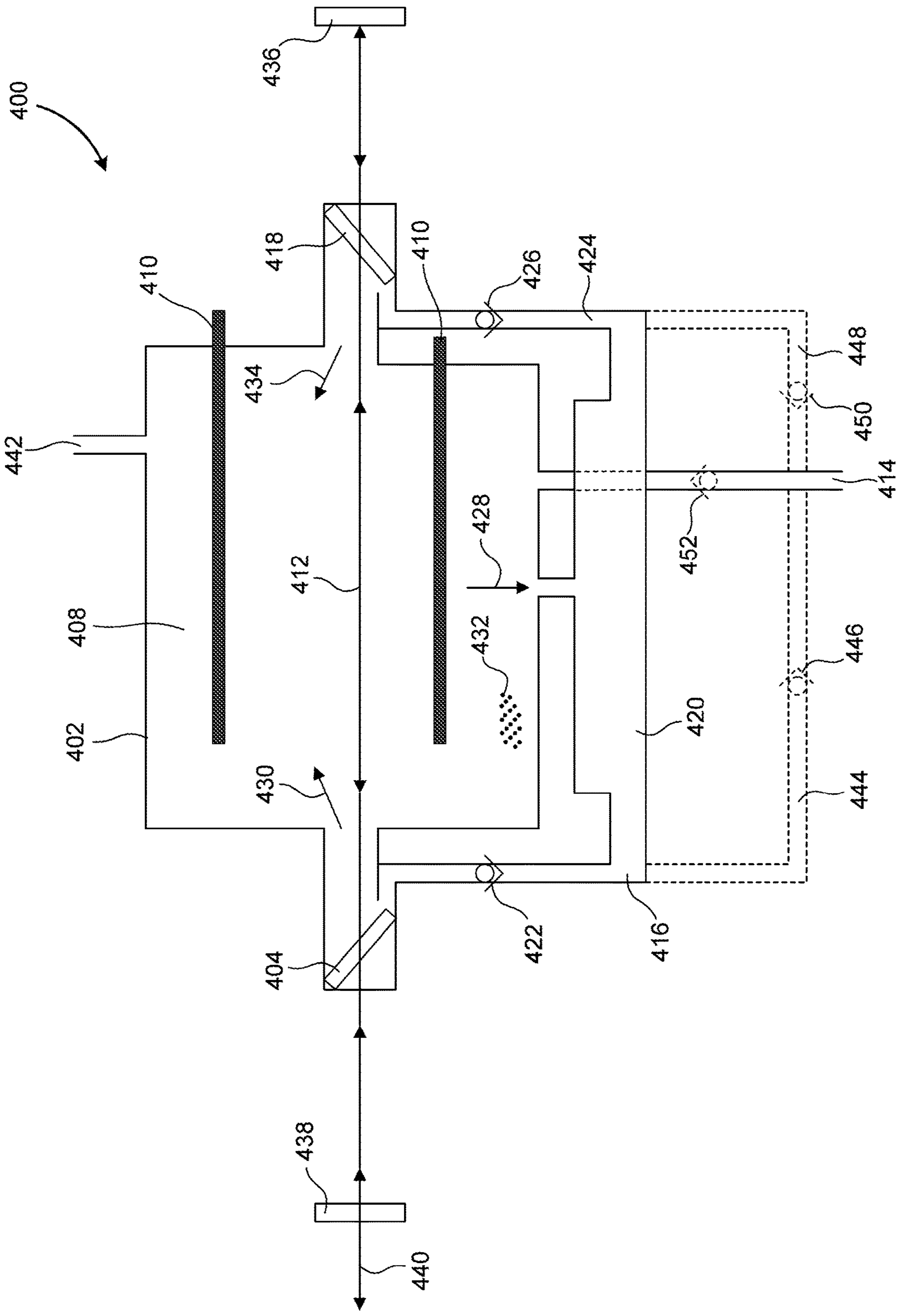

FIG. 4 shows a radiation source 400, according to some embodiments. In some embodiments, radiation source 400 shown in FIG. 4 can represent radiation source 300 shown in FIG. 3 in more detail. For example, FIG. 4 can show a more detailed view of conduit system 306. Unless otherwise noted, elements of FIG. 4 that have similar reference numbers (e.g., reference numbers sharing the two right-most numeric digits) as elements of FIG. 3 can have similar structures and functions.

In some embodiments, radiation source 400 comprises a gas chamber 402, a window 404, and a conduit system (e.g., conduit system 306, FIG. 3). Radiation source 400 can further comprise one or more electrodes 410. Radiation source 400 can further comprise a window 418. The structure and functions of window 418 can be similar to those of window 404. The conduit system comprises a refill conduit 414 (also "refill path") and a conduit 416, and a contaminant filter 420 (or simply filter). The conduit system can further comprise a unidirectional valve 422, a conduit 424, a unidirectional valve 426, and any combinations thereof.

In some embodiments, gas chamber 402 can confine a gas 408. The conduit system can be connected to gas chamber 402 to allow circulation of gas 408, for example, during operation to generate radiation 412. For example, the conduit system can circulate gas 408 to contaminant filter 420 that is connected to gas chamber 402 (gas flow direction designated by arrow 428). Contaminant filter 420 can remove contaminant particles 432 from gas chamber 402. Conduit 416 connects contaminant filter 420 back to gas chamber 402 and the gas flow is such that clean, filtered gas can blow on window 404 (gas flow direction designated by arrow 430). Window 404 can confine gas 408 from an environment external to gas chamber 402. A pressure differential device (not shown) can be used to cause gas flow in radiation source 400. For example, a blower can be inside gas chamber 402. Contaminant filter 420 may intercept a portion of the flow circulating through gas chamber 402 and redirect the flow toward windows 404 and 418 after removing contaminant particles 432. Gas 408 can be supplied or evacuated using refill conduit 414 that is connected to gas chamber 402. That is, refill conduit 414 can allow replacement of gas 408. It should be appreciated that the plumbing configuration shown in FIG. 4 is provided as a non-limiting example. For example, plumbing configurations can be envisaged that use more or fewer conduits, T-junctions, valves, and the like to achieve cleanliness of sensitive optical components, such as window 404 and window 418.

In some embodiments, arrows 428, 430, and 434 represent gas flows during operation of radiation source 400, for example, when generating radiation 412. To generate radiation 412, a voltage can be supplied to gas 408, for example, via one or more electrodes 410. Radiation 412 can have properties that depend on the applied voltage (e.g., an electrical pulse for a pulse of radiation). Windows 404 and 418 can allow radiation 412 to travel between gas chamber 402 and the environment external to gas chamber 402. In some embodiments, radiation source 400 is a gas discharge laser. Radiation source 400 can comprise an optical reflector 436 and a partial optical reflector 438. Optical reflector 436 and partial optical reflector 438 together function as an optical resonator. The optical resonator, in combination with a gain medium (e.g., gas 408) allow for amplification of radiation 412 as it travels back and forth between optical reflector 436 and partial optical reflector 438. Radiation source 400 can then output a beam of radiation 440 via transmission at partial optical reflector 438.

In some embodiments, the expected lifetime of gas chamber 402 depends on the first critical component to become inoperable via wear and tear. One example of a component subject to wear and tear is one or more electrodes 410. During operation of radiation source 400, one or more electrodes 410 interact with gas 408. The interaction causes the electrode material to combine with gas 408 and detach from one or more electrodes 410, effectively eroding one or more electrodes 410. Such erosion is expected and has a predictable erosion rate. The more radiation source 400 is operated, the more the electrodes erode. A benchmark for the lifetime of at least one or more electrodes 410 can be prescribed as the time it takes for one or more electrodes to go from new to eroded beyond the point of operability (e.g., can be measured in number of pulses generated throughout the lifetime). An undesirable behavior of radiation source 400 is one where a component fails unpredictably before the prescribed lifetime.

In some embodiments, one or more of contaminant particles 432 have a probability of settling on window 404 due to unintended gas flows. For example, it was mentioned earlier that, arrows 428, 430, and 434 represent gas flows during operation of radiation source 400. As radiation source 400 is operated, the quality of gas 408 degrades (e.g., becomes spent). Therefore, gas 408 can be replaced with fresh new gas (also "refill gas") by accessing gas chamber 402 using refill conduit 414. The refill gas may be of the same type as gas 408 in its unspent state or comprised of a different unspent gas. In some embodiments, a procedure to replace gas 408 comprises evacuating gas 408 using refill conduit 414 and then inserting the refill gas again using refill conduit 414. The procedure to replace gas 408 can stir up contaminant particles 432 that would normally be settled at the bottom of gas chamber 402. The stirred up contaminant particles 432 can have a higher probability of landing on windows 404 and 418. Moreover, the evacuation of gas 408 can pull contaminant particles 432 into refill conduit 414 and then subsequent insertion of the refill gas via the same conduit can blow contaminant particles 432 all around gas chamber 402, some even landing on windows 404 and 418.

In some embodiments, while window 404 is transparent and allows radiation 412 to pass through, contaminant particles can absorb a considerable amount of energy from radiation 412, thereby heating any contaminant particles 432 that have settled on window 404 and transferring that heat to window 404. The energy density in radiation 412 can be high enough to damage window 404 via heating of contaminant particles 432 on window 404. The failure of window 404 can occur unpredictably and well before exhausting the lifetime of one or more electrodes 410. In high-volume production of ICs, unpredictable machine downtime (e.g., unscheduled maintenance) is highly detrimental due to unexpected loss of production time. In a scenario where failure is predictable (e.g., occurring at the prescribed lifetime, scheduled maintenance), backup parts and procedures can be prepared. Structures and functions described in embodiments herein can reduce the probability of unpredictable early failure of pulsed-discharge radiation sources, and thus improve the average lifetime and reliability of pulsed-discharge radiation sources.

In some embodiments, the conduit system is configured to direct a flow of one of the refill gas, gas 408, or both the refill gas and gas 408. The direction of gas flow can change depending on the state of operation of radiation source 400 (e.g., during operation or during a refill procedure) based on the plumbing configuration of the conduit system. The gas flow can be manipulated in such a way so as to avoid stirring up or otherwise directing contaminant particles 432 toward windows 404 and 418. By manipulating the gas flows in this manner, the conduit system can increase the usable lifetime of windows 404 and 418. The useable lifetime of gas chamber 402, radiation source 400, and the like, are also improved since unexpected and costly disassembly can be avoided (since it may be more efficient to just outright replace a radiation source rather than disassemble it, the usable lifetime of a radiation source can be dictated by failure of just a window).

In some embodiments, unidirectional valve 422 can be disposed to intersect conduit 416. Unidirectional valve 422 can comprise a check valve, for example, a ball check valve, a flap check valve, a spring check valve, a gravity check valve, and the like. A check valve is a valve that closes to prevent a backward flow. Unidirectional valve 422 can represent a system of check valves that combines structures and/or features of any of the check valves mentioned above. For example, a ball check valve may be used vertically, whereby the ball is pushed down and closed by gravity (e.g., gravity check valve). While a check valve uses the pressure of gas travelling in the "wrong" direction to shut itself, the extra force (e.g., from gravity) on the shutting mechanism can provide a crack pressure threshold in order for a gas to push the check valve open. In some embodiments, unidirectional valve 422 can be a user-adjustable valve (e.g., an electrically actuated valve, a ball valve with an adjustable angle with respect to the direction of gravity, a pneumatic valve, and the like).

In some embodiments, during an evacuation of gas 408, unidirectional valve 422 can prevent gas flow (represented by arrow 430) from reversing. For example, gas 408 from gas chamber 402 is prevented from travelling toward window 404. In this manner, the probability of contaminant particles 432 contacting window 404 is reduced.

It was mentioned earlier that refill conduit 414 can become contaminated with contaminant particles 432. In order to avoid spreading contaminant particles 432, in some embodiments, the conduit system can comprise a separate evacuation conduit 442 (also "evacuation path") dedicated for evacuation of gas 408. In this scenario, refill conduit 414 can be dedicated for insertion of a refill gas. Since the evacuation and refill of gas are handled with separate conduits, this configuration is able to avoid blowing the contaminants in evacuation conduit 442 back into gas chamber 402. It should be appreciated that the location of refill conduit 414 and evacuation conduit 442 is not limited to the representation in FIG. 4 and that their locations can be chosen so as to minimize the likelihood of spreading contaminant particles 432 around gas chamber 402 (e.g., the locations of refill conduit 414 and evacuation conduit 442 can be interchanged).

In some embodiments, additional elements may be comprised by the conduit system that allow for manipulation of the flow of gas 408 and/or the refill gas. The structures of the additional elements are shown in FIG. 4 while the functions are described in more detail in reference to FIG. 5. The conduit system can further comprise conduit 444 (also "bypass conduit"), unidirectional valve 446, conduit 448 (also "bypass conduit"), and unidirectional valve 450. Unidirectional valve 452 can be disposed to intersect refill conduit 414. Unidirectional valve 452 can prevent gas from entering gas chamber 402 via refill conduit 414. Any combinations of the structures mentioned above can be employed to achieve a desired flow direction of gas 408 and the refill gas.

It should be appreciated that, in some embodiments, conduit 424, conduit 448, unidirectional valve 426, unidirectional valve 450, and window 418 may be structured and configured similar to conduit 416, conduit 444, unidirectional valve 422, unidirectional valve 446, and window 404, respectively. For example, the similarities may be a structural and/or functional symmetry, exactly or approximately.

Figure 5A:
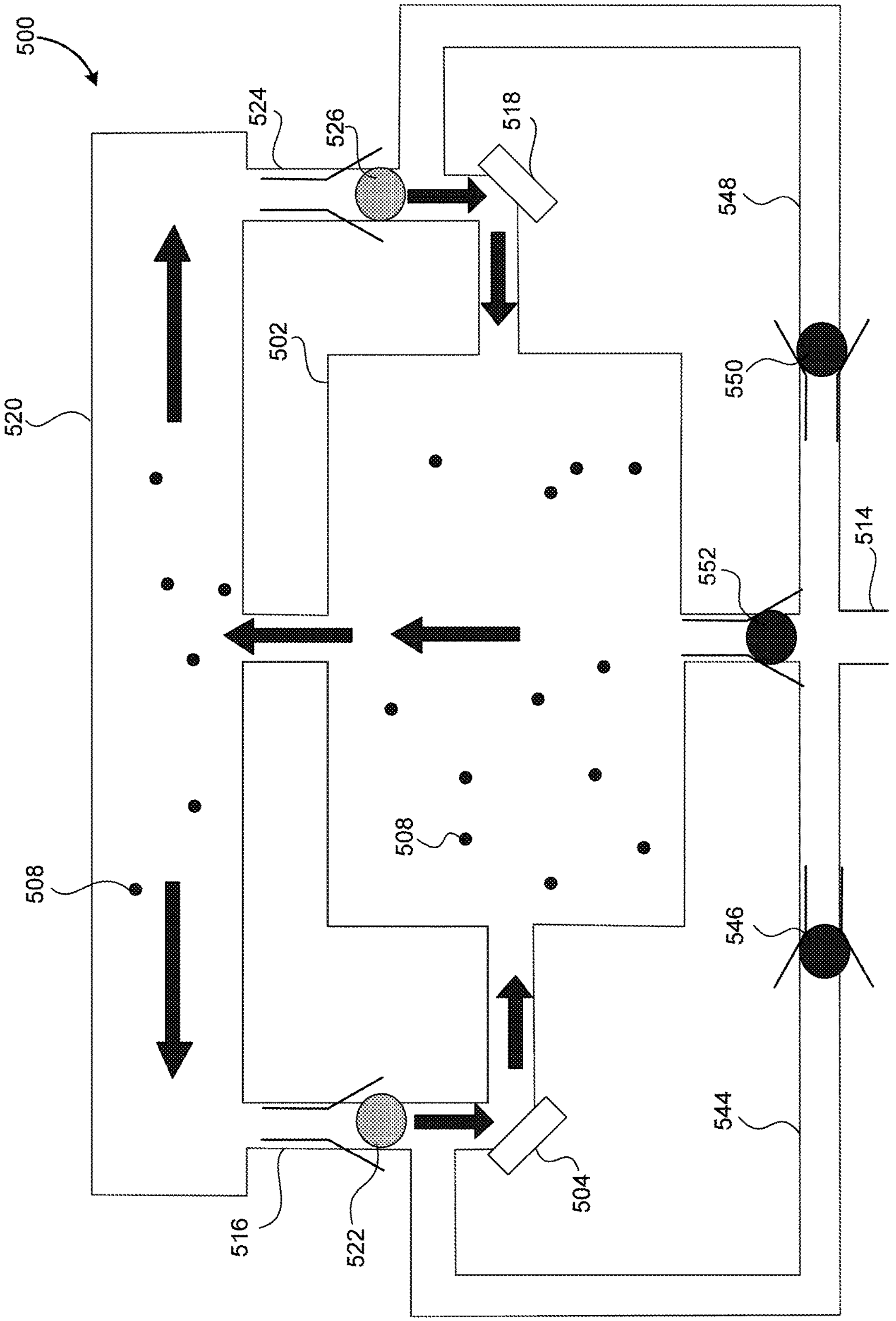
FIGS. 5A, 5B and 5C each show a portion of a radiation source, according to some embodiments.
Figure 5B:
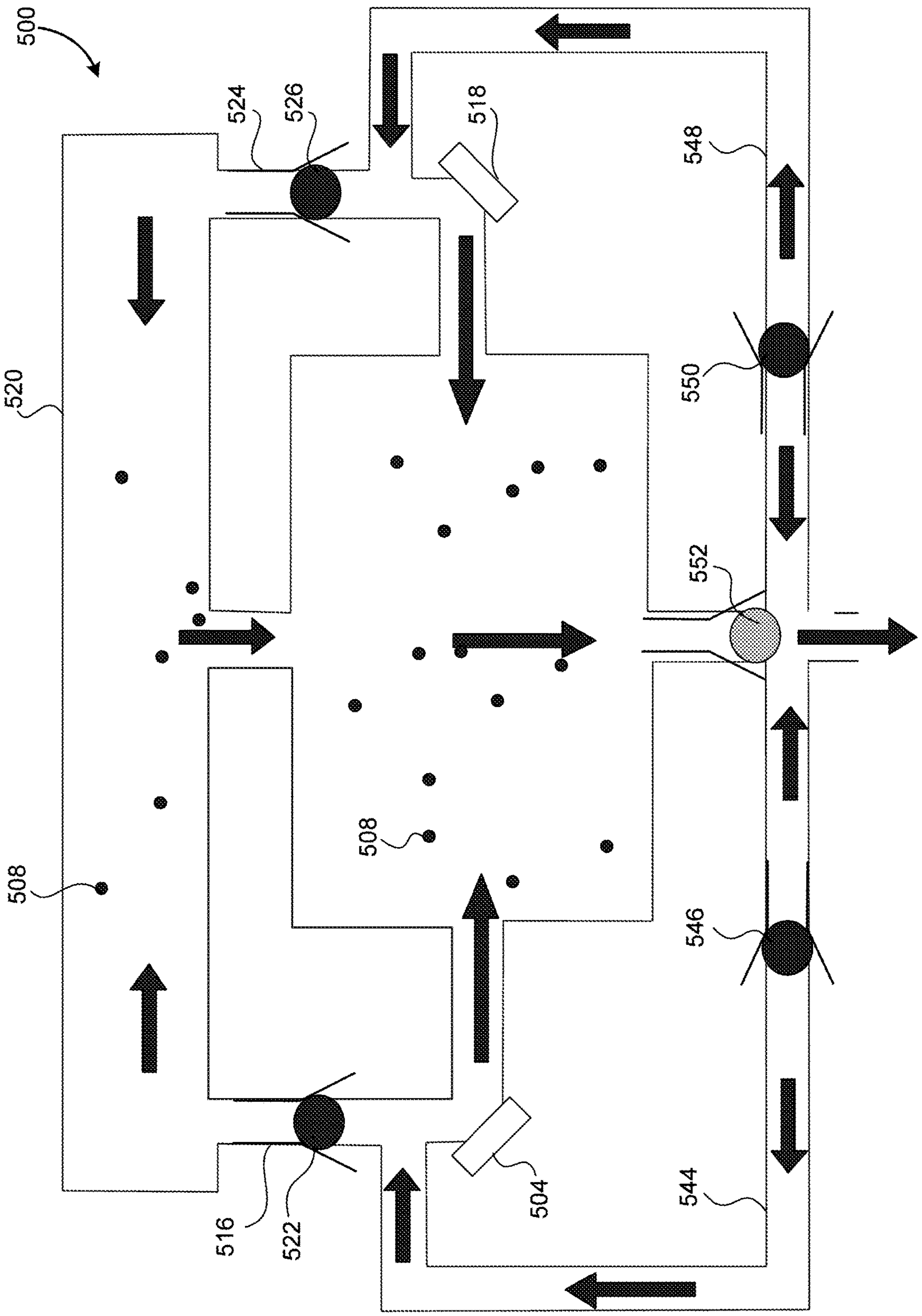
Figure 5C:
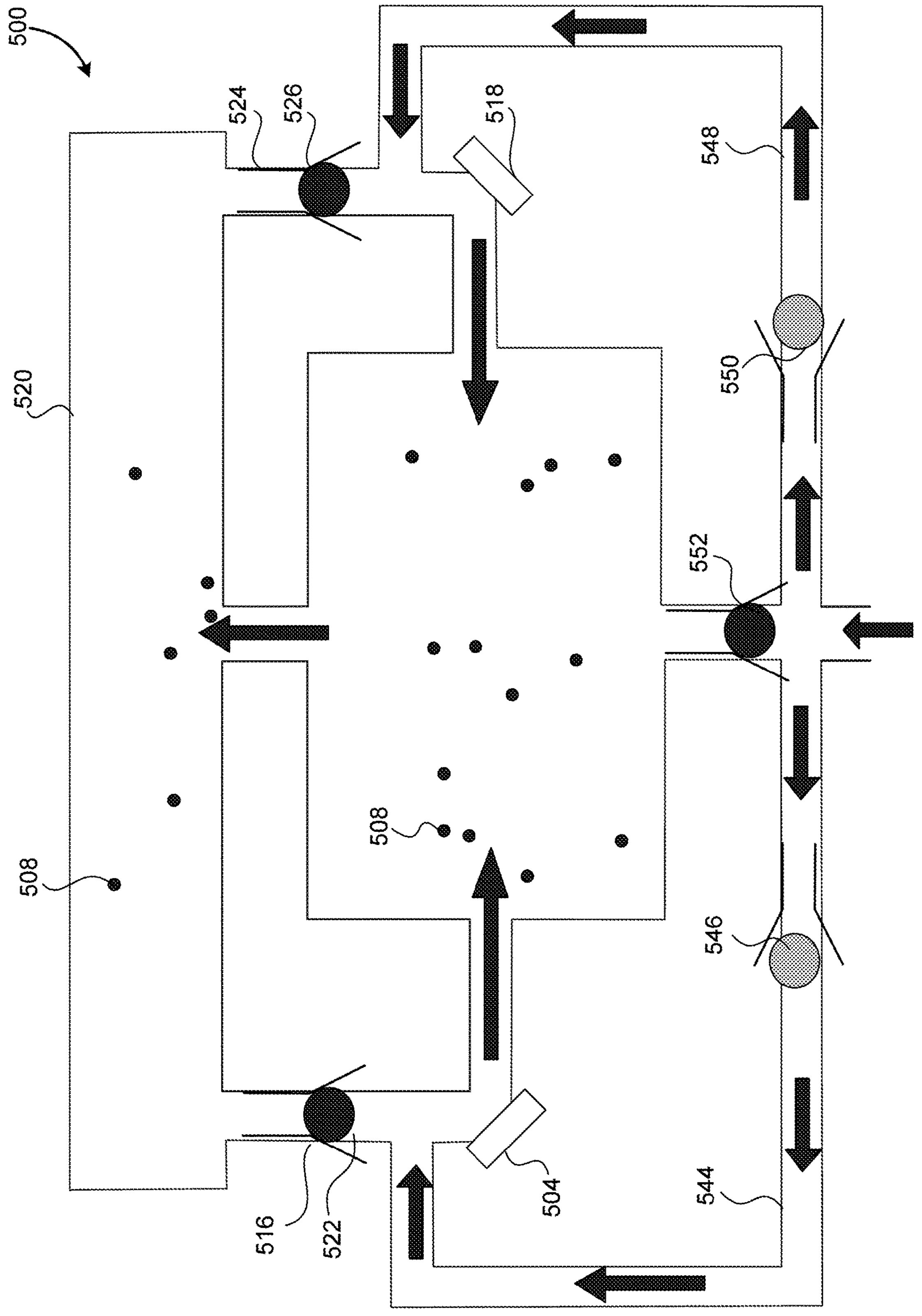

FIGS. 5A, 5B, and 5C show a portion of a radiation source 500 according to some embodiments. In some embodiments, radiation source 500 can also represent radiation source 300 (FIG. 3) and/or radiation source 400 (FIG. 4) in more detail. For example, FIG. 5 can show a more detailed view of conduit system 306 and its functions. Unless otherwise noted, elements of FIG. 5 that have similar reference numbers (e.g., reference numbers sharing the two right-most numeric digits) as elements of FIGS. 3 and 4 can have similar structures and functions.

Referring to FIG. 5A, flows of a gas 508 are shown (indicated by arrows and also shown as gas particles and not to be confused with contaminant particles 432 of FIG. 4). Radiation source 500 comprises a gas chamber 502, a window 504, and a conduit system (e.g., conduit system 306, FIG. 3). Radiation source 500 can further comprise a window 518. The conduit system can comprise a contaminant filter 520, a refill conduit 514, a conduit 516, a conduit 524, a unidirectional valve 522, and a unidirectional valve 526. The conduit system can further comprise, a conduit 544, a conduit 548, a unidirectional valve 546, a unidirectional valve 550, and a unidirectional valve 552. Some of these elements have already been described in reference to their respective counterparts in FIG. 4 (e.g., referenced by numbers sharing the two right-most numeric digits).

In some embodiments, a flow of gas 508 (represented by arrows) is as shown in FIG. 5A during operation of radiation source 500 (e.g., generating radiation). Contaminant filter 520 can remove contaminants (e.g., contaminant particles 432 (FIG. 4)) from gas chamber 502. Conduit 516 connects contaminant filter 520 back to gas chamber 502 and the gas flow is such that clean, filtered gas can blow on window 504. To facilitate the direction of flow, unidirectional valve 522 is shown in the open state to allow filtered gas to blow on window 504. Conversely, unidirectional valve 522 can close to prevent gas flow from reversing to prevent drawing contaminants from gas chamber 502 toward window 504. Though functions are described in reference to contaminants on window 504, it is to be appreciated that similar or symmetric processes are employed with respect to window 518 using corresponding conduits and valves.

In reference to FIG. 5B, in some embodiments, a flow of gas 508 during evacuation of gas 508 is represented by the arrows shown. In instances where the gas flow is shown to move away in both directions from a unidirectional valve (e.g., unidirectional valves 546, and 550), such valves may be closed when the gas flow is in the direction against the directionality of the unidirectional valve or the pressure of the gas flow is insufficient to overcome the cracking-pressure threshold of the unidirectional valve. To facilitate evacuation of gas 508, unidirectional valve 552 is shown in the open state to allow gas 508 to exit gas chamber 502 in a manner that prevents gas 508 and any contaminants from flowing toward window 504.

In reference to FIG. 5C, in some embodiments, a flow of refill gas during refilling gas chamber 502 is represented by the arrows shown. To facilitate refilling gas chamber 502, unidirectional valve 546 is shown in the open state to allow the refill gas to enter gas chamber 502. Unidirectional valve 552 is in the closed state so as to prevent a flow of gas from gas chamber 502 toward window 504 (preventing contaminants present in gas chamber 502 from flowing toward window 504). In this configuration, the refill gas (which is pure and contaminant-free) enters gas chamber 502 via conduit 544. Conduit 544 can be a bypass conduit that bypasses the orifice that connects gas chamber 502 and refill conduit 514. That is, conduit 544 makes direct connection between conduit 516 and refill conduit 514. The uncontaminated refill gas (or filtered gas 508 in FIG. 5A) can flow across windows 504 and 518 while not depositing any dust on windows 504 and 518. The uncontaminated refill gas can also exert a pressure on window 504 that can blow away any contaminants present on window 504. In this manner, the usable lifetime of at least window 504 can be increased owing to the reduced probability of contaminants on window 504 absorbing radiation energy.

Figure 6:
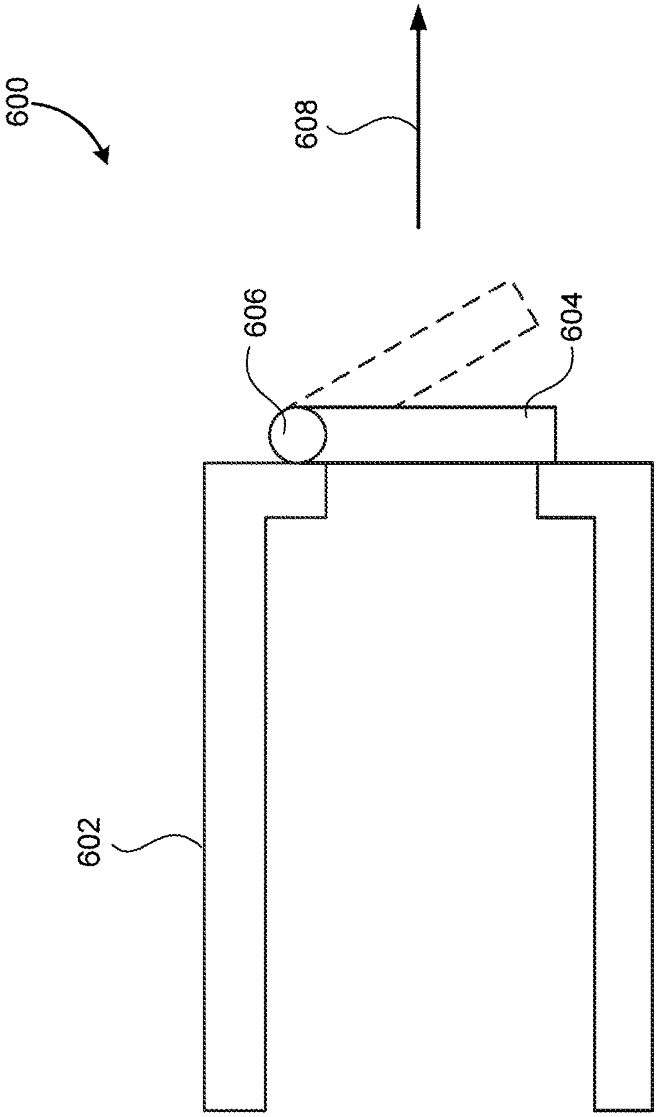
FIG. 6 shows a unidirectional valve, according to some embodiments.

FIG. 6 shows a unidirectional valve 600, according to some embodiments. Unidirectional valve 600 comprises a conduit section 602 and a flap 604. Unidirectional valve 600 can further comprise a hinge 606. Hinge 606 can attach flap 604 to conduit section 602. If hinge 606 is omitted, flap 604 can be a flexible flap (e.g., flexure) and attach directly to conduit section 602. Hinge 606 can be spring loaded such that a cracking-pressure threshold can be defined (e.g., valve opens only if flow pressure exceeds a predetermined amount). A flexure flap can also define a cracking-pressure threshold. Arrow 608 represents a direction of flow that is allowed by unidirectional valve 600.

Figure 7:
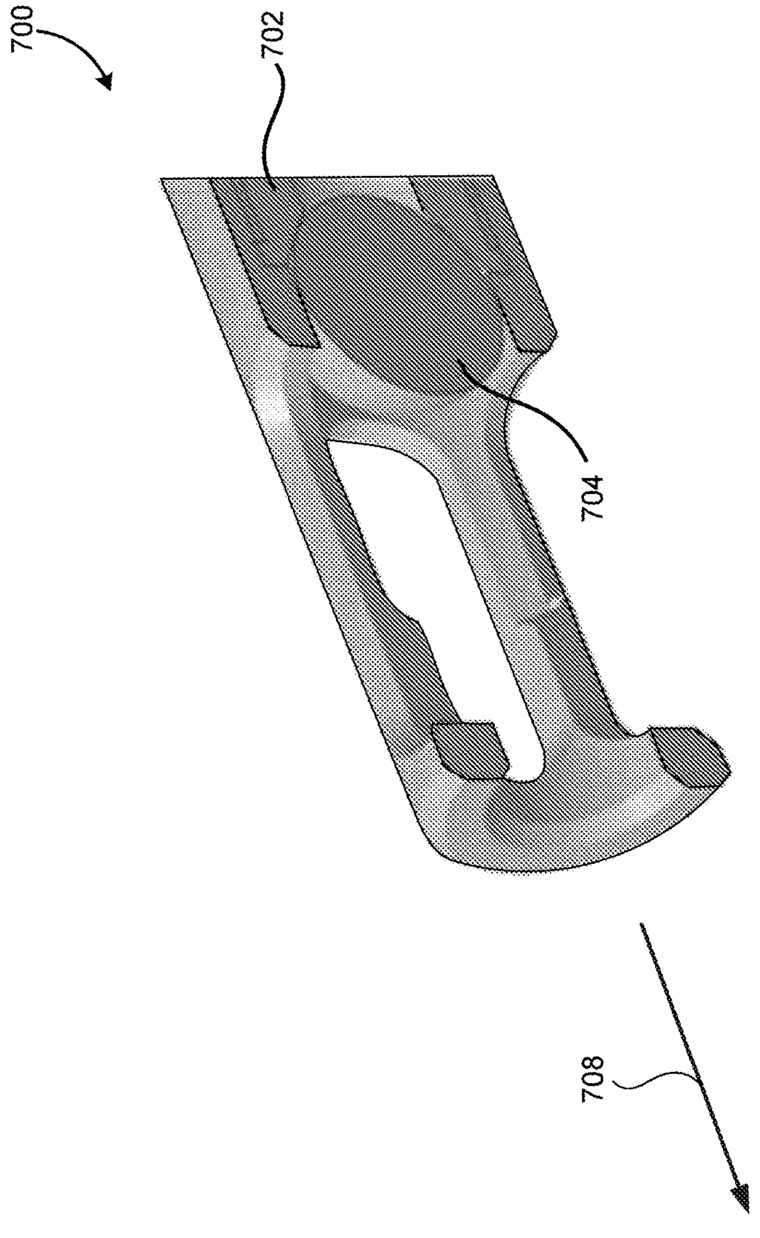
FIG. 7 shows a cross-section of a unidirectional valve, according to some embodiments.

FIG. 7 shows a cross-section of a unidirectional valve 700, according to some embodiments. Unidirectional valve 700 comprises a conduit section 702 and a ball 704. Ball 704 can be spring loaded such that a cracking-pressure threshold can be defined. Unidirectional valve 700 can also define a cracking-pressure threshold even without a spring (e.g., using gravity and the weight of ball 704). Arrow 708 represents a direction of flow that is allowed by unidirectional valve 700.

Figure 8:
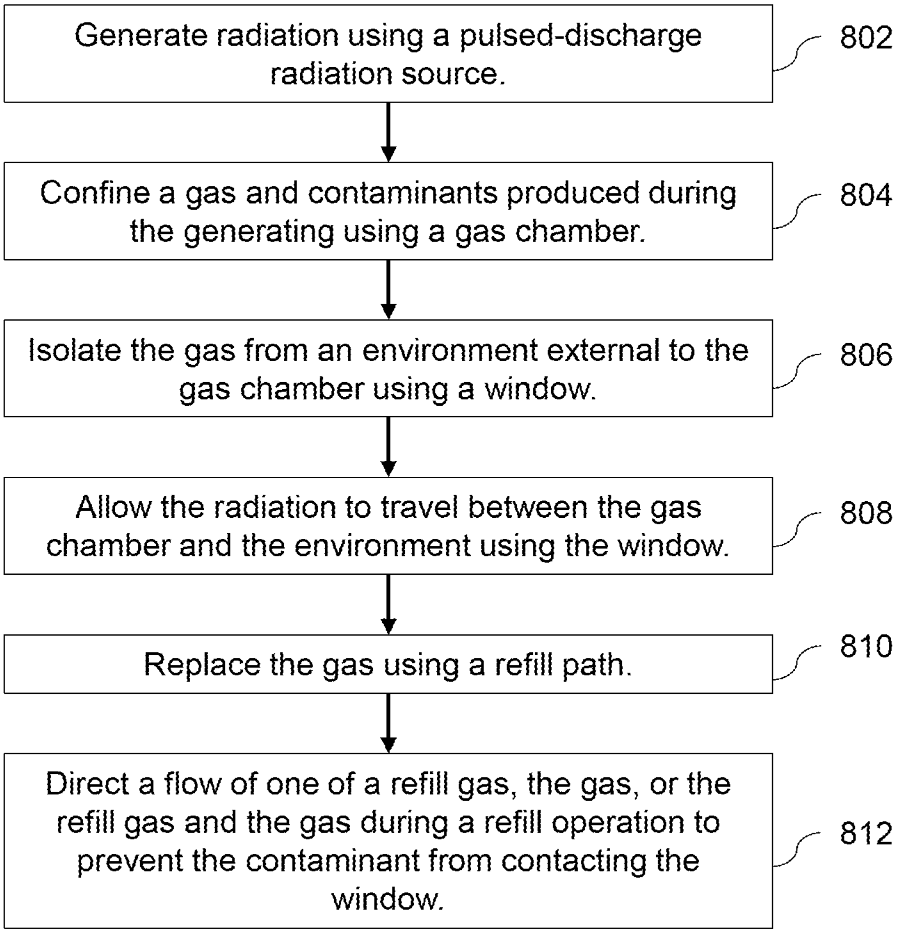
FIG. 8 is a flow chart that shows method steps for performing functions of embodiments described herein, according to some embodiments.

FIG. 8 shows method steps for performing functions described herein, according to some embodiments. The method steps of FIG. 8 can be performed in any conceivable order and it is not required that all steps be performed. Moreover, the method steps of FIG. 8 described below merely reflect an example of steps and are not limiting. That is, further method steps and functions may be envisaged based upon embodiments described in reference to FIGS. 1-7.

At step 802, radiation is generated using a pulsed-discharge radiation system.

At step 804, a gas and contaminants produced during the generating are confined using a gas chamber.

At step 806, the gas is isolated from an environment external to the gas chamber using a window.

At step 808, the radiation is allowed to travel between the gas chamber and the environment using the window.

At step 810, the gas is replaced using a refill path.

At step 812, a flow of one of a refill gas, the gas, or the refill gas and the gas during a refill operation is directed to prevent the contaminant from contacting the window.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam," "light," "illumination," and the like as used herein may encompass all types of electromagnetic radiation, for example, ultraviolet (UV) radiation (for example, having a wavelength $\lambda$ of 365, 248, 193, or 157 nm). DUV generally refers to radiation having wavelengths ranging from 130 nm to 428 nm, and in some embodiments, an excimer laser can generate DUV radiation used within a lithographic apparatus. It should be appreciated that radiation having a wavelength in the range of, for example, 130-428 nm relates to radiation with a certain wavelength band, of which at least part is in the range of 130-428 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

Other aspects of the invention are set out in the following numbered clauses.

1. A pulsed discharge radiation source configured to generate radiation, the pulsed-discharge radiation system comprising:
a gas chamber configured to confine a gas and a contaminant produced during generation of the radiation;
a window configured to isolate the gas from an environment external to the gas chamber and to allow the radiation to travel between the gas chamber and the environment; and
a conduit system comprising:
a refill path configured to allow a replacement of the gas; and
a conduit configured to circulate the gas to or from the gas chamber during the generation of the radiation,
wherein the conduit system is configured to direct a flow of one of a refill gas, the gas, or the refill gas and the gas at least during a refill operation to prevent the contaminant from contacting the window, whereby the conduit system increases usable lifetime of at least the window.
2. The pulsed-discharge radiation source of clause 1, wherein the conduit system further comprises a valve disposed to intersect the conduit and configured to prevent a flow of at least a portion of the contaminant toward the window.
3. The pulsed-discharge radiation source of clause 2, wherein the valve comprises a unidirectional valve.
4. The pulsed-discharge radiation source of clause 3, wherein the unidirectional valve comprises at least one of a ball check valve, flap check valve, spring check valve, and gravity check valve.
5. The pulsed-discharge radiation source of clause 2, wherein the valve comprises a user-adjustable valve.
6. The pulsed-discharge radiation source of clause 1, wherein:
the conduit system further comprises a bypass conduit and a unidirectional valve disposed to intersect the bypass conduit;
the bypass conduit connects the conduit to the refill path; and
the unidirectional valve is configured to prevent a flow of the gas from the gas chamber and toward the window.
7. The pulsed-discharge radiation source of clause 1, wherein the refill path is further configured to allow evacuation of the gas.
8. The pulsed-discharge radiation source of clause 1, wherein the conduit system further comprises an evacuation path configured to allow evacuation of the gas to prevent the contaminant from entering the refill path.
9. The pulsed-discharge radiation source of clause 1, further comprising an electrical connection configured to deliver an electrical pulse to the gas to generate the radiation.
10. The pulsed-discharge radiation source of clause 1, wherein the radiation comprises DUV radiation.
11. A method comprising:
generating radiation using a pulsed-discharge radiation system;
confining a gas and contaminants produced during the generating, using a gas chamber;
isolating the gas from an environment external to the gas chamber using a window;
allowing the radiation to travel between the gas chamber and the environment using the window;
replacing the gas using a refill path;
circulating the gas to or from the gas chamber during the generating; and
directing a flow of one of a refill gas, the gas, or the refill gas and the gas during a refill operation to prevent the contaminants from contacting the window.
12. The method of clause 11, further comprising preventing a flow of at least a portion of the contaminants toward the window using a unidirectional valve.
13. The method of clause 12, further comprising preventing a flow of the gas from the gas chamber toward the window using a further unidirectional valve, wherein the further unidirectional valve is disposed to intersect a bypass conduit that connects the conduit to the refill path.
14. The method of clause 11, further comprising evacuating the gas using the refill path.
15. The method of clause 11, further comprising evacuating the gas using an evacuation path.
16. The method of clause 11, wherein the generating comprises delivering an electrical pulse to the gas using an electrical connection.
17. The method of clause 11, wherein the radiation comprises DUV radiation.
18. A lithographic apparatus comprising:
a pulsed-discharge illumination system configured to generate radiation to illuminate a pattern of a patterning device, the illumination system comprising:
a gas chamber configured to confine a gas and contaminants produced during generation of the radiation;
a window configured to isolate the gas from an environment external to the gas chamber and to allow the radiation to travel between the gas chamber and the environment; and
a conduit system comprising:
a refill path configured to allow a replacement of the gas; and
a conduit configured to circulate the gas to or from the gas chamber during the generation of the radiation,
wherein the conduit system is configured to direct a flow of one of a refill gas, the gas, or the refill gas and the gas at least during a refill operation to prevent the contaminant from contacting the window, whereby the conduit system increases usable lifetime of at least the window; and
a projection system configured to project an image of the pattern onto a substrate.
19. The lithographic apparatus of clause 18, wherein the conduit system further comprises a unidirectional valve disposed to intersect the conduit and configured to prevent a flow of at least a portion of the contaminant toward the window.

20. The lithographic apparatus of clause 19, wherein the unidirectional valve comprises at least one of a ball check valve, flap check valve, spring check valve, and gravity check valve.

21. The lithographic apparatus of clause 18, wherein:

the conduit system further comprises a bypass conduit and a unidirectional valve disposed to intersect the bypass conduit;

the bypass conduit connects the conduit to the refill path; and the unidirectional valve is configured to prevent a flow of the gas from the gas chamber and toward the window.

22. The lithographic apparatus of clause 18, wherein the conduit system further comprises an evacuation path configured to allow evacuation of the gas to prevent the contaminant from entering the refill path.

23. The lithographic apparatus of clause 18, wherein the radiation comprises DUV radiation.

The breadth and scope of the protected subject matter should not be limited by any of the above-described exemplary embodiments, but should be defined only in accordance with the following claims and their equivalents.

The invention claimed is:

1. A pulsed-discharge radiation source configured to generate radiation, the pulsed-discharge radiation system comprising:

a gas chamber configured to confine a gas and a contaminant produced during generation of the radiation;

a window configured to isolate the gas from an environment external to the gas chamber and to allow the radiation to travel between the gas chamber and the environment; and a conduit system comprising:

a refill path configured to allow a replacement of the gas;

a conduit configured to circulate the gas to or from the gas chamber during the generation of the radiation, and a bypass conduit and a unidirectional valve disposed to intersect the bypass conduit, the bypass conduit connecting the conduit to the refill path, the unidirectional valve being configured to prevent a flow of the gas from the gas chamber and toward the window;

wherein the conduit system is configured to direct a flow of one of a refill gas, the gas, or the refill gas and the gas at least during a refill operation to prevent the contaminant from contacting the window, whereby the conduit system increases usable lifetime of at least the window.

2. The pulsed-discharge radiation source of claim 1, wherein the conduit system further comprises a valve disposed to intersect the conduit and configured to prevent a flow of at least a portion of the contaminant toward the window.

3. The pulsed-discharge radiation source of claim 2, wherein the valve comprises a unidirectional valve.

4. The pulsed-discharge radiation source of claim 3, wherein the unidirectional valve comprises at least one of a ball check valve, flap check valve, spring check valve, and gravity check valve.

5. The pulsed-discharge radiation source of claim 2, wherein the valve comprises a user-adjustable valve.

6. The pulsed-discharge radiation source of claim 1, wherein the refill path is further configured to allow evacuation of the gas.

7. The pulsed-discharge radiation source of claim 1, wherein the conduit system further comprises an evacuation path configured to allow evacuation of the gas to prevent the contaminant from entering the refill path.

8. The pulsed-discharge radiation source of claim 1, further comprising an electrical connection configured to deliver an electrical pulse to the gas to generate the radiation.

9. The pulsed-discharge radiation source of claim 1, wherein the radiation comprises DUV radiation.

10. A method comprising:

generating radiation using a pulsed-discharge radiation system;

confining a gas and contaminants produced during the generating, using a gas chamber;

isolating the gas from an environment external to the gas chamber using a window;

allowing the radiation to travel between the gas chamber and the environment using the window;

replacing the gas using a refill path;

circulating the gas to or from the gas chamber during the generating;

preventing a flow of the gas from the gas chamber toward the window using a further unidirectional valve, wherein the further unidirectional valve is disposed to intersect a bypass conduit that connects the conduit to the refill path; and directing a flow of one of a refill gas, the gas, or the refill gas and the gas during a refill operation to prevent the contaminants from contacting the window.

11. The method of claim 10, further comprising preventing a flow of at least a portion of the contaminants toward the window using a unidirectional valve.

12. The method of claim 10, further comprising evacuating the gas using the refill path.

13. The method of claim 10, further comprising evacuating the gas using an evacuation path.

14. The method of claim 10, wherein the generating comprises delivering an electrical pulse to the gas using an electrical connection.

15. The method of claim 10, wherein the radiation comprises DUV radiation.

16. A lithographic apparatus comprising:

a pulsed-discharge illumination system configured to generate radiation to illuminate a pattern of a patterning device, the illumination system comprising:

a gas chamber configured to confine a gas and contaminants produced during generation of the radiation;

a window configured to isolate the gas from an environment external to the gas chamber and to allow the radiation to travel between the gas chamber and the environment; and a conduit system comprising:

a refill path configured to allow a replacement of the gas;

a conduit configured to circulate the gas to or from the gas chamber during the generation of the radiation, and a bypass conduit and a unidirectional valve disposed to intersect the bypass conduit, the bypass conduit connecting the conduit to the refill path and the unidirectional valve being configured to prevent a flow of the gas from the gas chamber and toward the window;

wherein the conduit system is configured to direct a flow of one of a refill gas, the gas, or the refill gas and the gas at least during a refill operation to prevent the contaminant from contacting the window, whereby the conduit system increases usable lifetime of at least the window; and a projection system configured to project an image of the pattern onto a substrate.

17. The lithographic apparatus of claim 16, wherein the conduit system further comprises a unidirectional valve disposed to intersect the conduit and configured to prevent a flow of at least a portion of the contaminant toward the window.

18. The lithographic apparatus of claim 17, wherein the unidirectional valve comprises at least one of a ball check valve, flap check valve, spring check valve, and gravity check valve.

19. The lithographic apparatus of claim 16, wherein the conduit system further comprises an evacuation path configured to allow evacuation of the gas to prevent the contaminant from entering the refill path.

20. The lithographic apparatus of claim 16, wherein the radiation comprises DUV radiation.

* * * * *